(12) United States Patent
Aaltonen et al.

(10) Patent No.: US 9,197,242 B2
(45) Date of Patent: Nov. 24, 2015

(54) DELTA-SIGMA ANALOG-TO-DIGITAL CONVERTER

(71) Applicant: MURATA MANUFACTURING CO., LTD., Kyoto (JP)

(72) Inventors: Lasse Aaltonen, Espoo (FI); Teemu Salo, Riihimäki (FI); Tero Sillanpää, Espoo (FI)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 14/559,176

(22) Filed: Dec. 3, 2014

(65) Prior Publication Data

US 2015/0162935 A1    Jun. 11, 2015

(30) Foreign Application Priority Data

Dec. 5, 2013   (FI) ..................................... 20136225

(51) Int. Cl.
*H03M 3/00*     (2006.01)
(52) U.S. Cl.
CPC .............. *H03M 3/368* (2013.01); *H03M 3/466* (2013.01); *H03M 3/47* (2013.01); *H03M 3/474* (2013.01)
(58) Field of Classification Search
CPC ....... H03M 3/30; H03M 3/368; H03M 3/466; H03M 3/364; H03M 3/356
USPC .................................................. 341/143, 155
See application file for complete search history.

(56) References Cited

U.S. PATENT DOCUMENTS

| 5,627,536 | A   |    | 5/1997  | Ramirez |
| 6,593,870 | B2 | *  | 7/2003  | Dummermuth et al. ...... 341/155 |
| 7,760,118 | B2 | *  | 7/2010  | Rzehak .......................... 341/143 |
| 8,339,299 | B2 | *  | 12/2012 | Quiquempoix et al. ...... 341/143 |
| 8,841,962 | B1 | *  | 9/2014  | Trampitsch ................... 327/554 |
| 2007/0247340 | A1 |  | 10/2007 | Tada |
| 2008/0024348 | A1 |  | 1/2008  | Liu |
| 2011/0063155 | A1 |  | 3/2011  | Chen et al. |

FOREIGN PATENT DOCUMENTS

WO    WO 2004/030222 A1    4/2004

OTHER PUBLICATIONS

Finnish Search Report dated Sep. 30, 2014 corresponding to Finnish Patent Application No. 20136225, 2 pages.
M. Lemkin et al.: "A three-axis micromachined accelerometer with a CMOS position-sense interface and digital offset-trim electronics," IEEE Journal of Solid-State Circuits, vol. 34 No. 4, Apr. 1999, pp. 456-468.

(Continued)

*Primary Examiner* — Khai M Nguyen
(74) *Attorney, Agent, or Firm* — Squire Patton Boggs (US) LLP

(57) ABSTRACT

A delta-sigma analog-to-digital converter for use with multiplexed input channels. The delta-sigma analog-to-digital converter comprising at least one integrator that includes an operational amplifier, a memory element with a leakage preventing switch structure for each input channel and a reset switch element adapted to reset the operational amplifier between the input channels. The specific switch design prevents effectively channel to channel cross talk between multiplexed channels.

12 Claims, 9 Drawing Sheets

(56) References Cited

OTHER PUBLICATIONS

M. Kämäräinen et al.: "A 1.5 microwatt 1 volt 2nd-order delta-sigma sensor front-end with signal boosting and offset compensation for a capacitive 3-axis micro-accelerometer," 2008 IEEE Int. Solid-State Circuits Conf., Feb. 3-7, 2008, Session 32.2, pp. 578-579.

M. Paavola et al.: "A micropower delta sigma-based interface ASIC for a capacitive 3-axis micro-accelerometer," IEEE Journal of Solid-State Circuits, vol. 44 No. 11, Nov. 2009, pp. 3193-3210.
International Search Report dated Apr. 10, 2015, for corresponding Int'l Appln. No. PCT/IB2014/066579.

* cited by examiner

DELTA-SIGMA ANALOG-TO-DIGITAL CONVERTER

BACKGROUND

1. Field

The present invention relates to electronic devices for analog-to-digital conversion, more specifically to a sigma-delta analog-to-digital converter for use with multiplexed input channels.

2. Description of the Related Art

Micro-Electro-Mechanical Systems or MEMS can be defined as micro-scale mechanical and electro-mechanical systems where at least some elements have a mechanical functionality. MEMS structures can be applied to quickly and accurately detect very small changes in physical properties.

The vast majority of electronic devices today use the MEMS sensors to detect some specific physical phenomenon. The measured signals describing these phenomena are usually in the analog domain. Since signal processing and storage are effective to perform in the digital domain, the signals have to be converted to the digital domain using Analog-to-Digital Converters (ADC).

One method for encoding analog signals to digital signals is delta-sigma-conversion. In the delta-sigma-conversion, an analog signal is first encoded with sigma-delta modulation and digital filtering is used to form a higher-resolution digital output. Delta-sigma analog-to-digital converters are usually used with modern ASIC technologies, since their topology does not require perfect matching of high performance passive components, a higher sampling frequency can be used to improve the resolution, and required decimation filtering is effectively implemented with modern ASIC technologies.

In multi signal processing systems there is a need to convert many signals to the digital domain. The challenge with delta-sigma analog-to-digital converters is that they need a considerable time to settle between input signals, and this settling causes delay to the switching between signal channels. Due to this, when high data resolution has been required, parallel delta-sigma modulators have been used. This approach is, however, chip area consuming.

Another conventional option is to reduce the delay by multiplying the number of digital filters and switching the output signal of the delta-sigma modulator between them. The settling time of the modulator can be taken into account by discarding some samples of the delta-sigma-modulator. This facilitates area reduction by multiplexing but reduces the data rate and signal bandwidth of the conversion.

SUMMARY

It is an object of the present invention to provide a new solution that facilitates reduction of the MEMS interface ASIC size without substantially compromising the data rate of the conversion.

The claims define a delta-sigma analog-to-digital converter for use with multiplexed input channels. The delta-sigma analog-to-digital converter comprises at least one integrator that includes an operational amplifier, a memory element with a leakage preventing switch structure for each input channel and a reset switch element adapted to reset the operational amplifier between the input channels.

In the following the present invention and the other objects and advantages thereof will be described in an exemplifying manner with reference to the annexed drawings.

DETAILED DESCRIPTION

The following embodiments are exemplary. Although the specification may refer to "an", "one", or "some" embodiment(s), this does not necessarily mean that each such reference is to the same embodiment(s), or that the feature only applies to a single embodiment. Single features of different embodiments may be combined to provide further embodiments.

In the following, features of the invention will be described with a simple example of a circuit structure with which various embodiments of the invention may be implemented. Only elements relevant for illustrating the embodiments are described in detail. Components and implementations of circuit structures that are generally known to a person skilled in the art may not be specifically described herein.

The invention is applicable to any circuit structure or combination of circuit structures that is capable of processing analog input signals into a digital output signal. A signal may refer herein to any impulse or a fluctuating electric quantity, such as voltage, current, or electric field strength, whose variations represent variation of another quantity.

The term delta-sigma converter refers here to an element that uses delta-sigma modulation. A delta-sigma analog to digital converter (DSADC) can be of $1^{st}$-$2^{nd}$-$3^{rd}$- or higher order. The topology of the DSADC may include feed forward and/or feedback paths. Dynamic element matching (DEM) may be employed when more than two-level quantization is utilized. A noise shaping frequency response of high-pass, or band-stop-type can be applied, or the response may be specially designed for a specific application. The signal path of the DSADC may be single-ended or differential.

The chip area of a DSADC divides into an analog part and a digital part. The digital part may comprise one or more decimation filters, and some auxiliary digital blocks, such as clock generation circuitry and memory elements. This area tends to scale down when the line width of the ASIC process reduces. The analog part may include switches, capacitors, comparators and integrators or resonators. The area of the analog part scales down very slowly with process scaling.

DSADC may comprise a delta-sigma modulator (DSM) and a filtering element.

Figure 1:
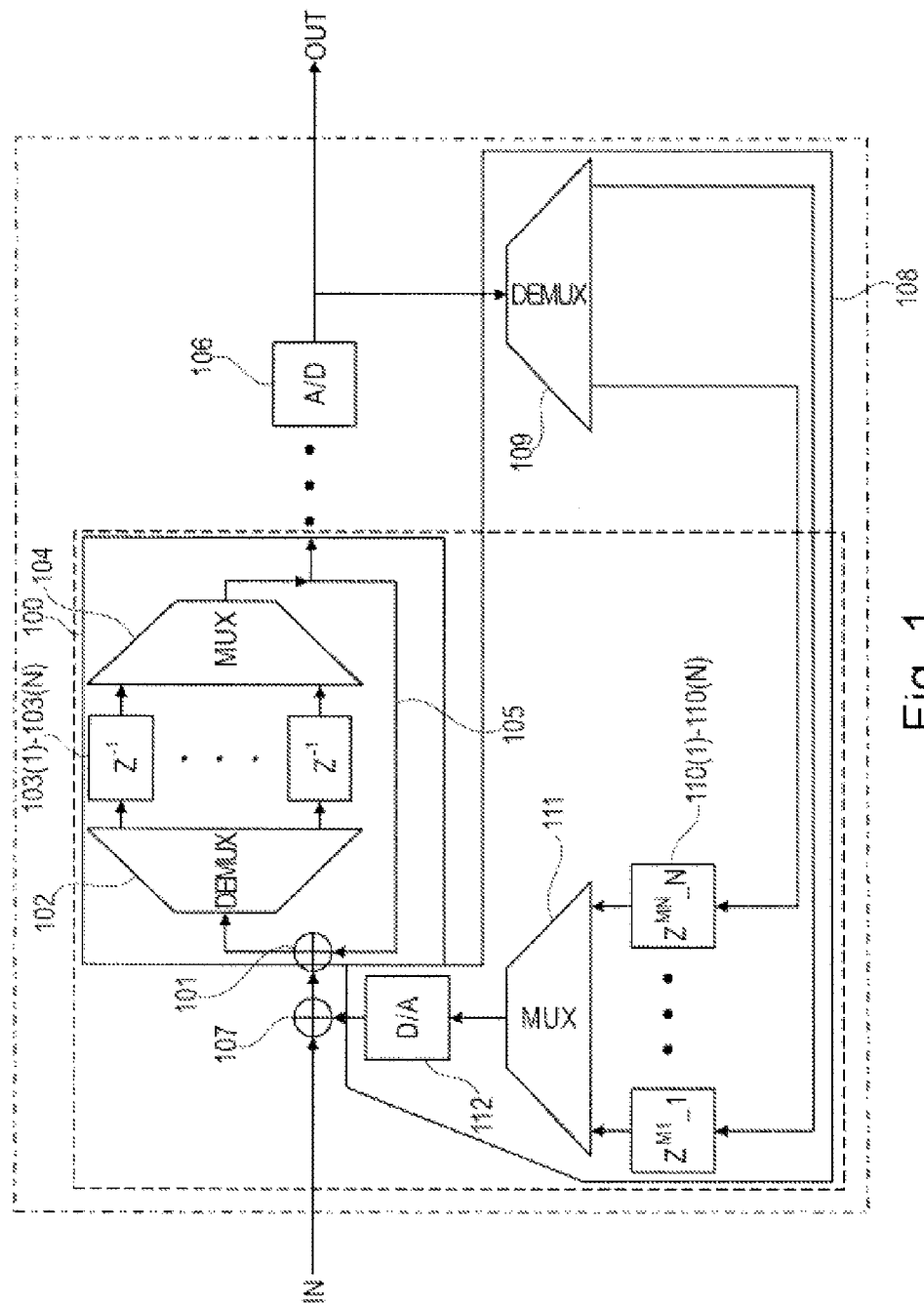
FIG. 1 discloses schematically an embodiment of a delta-sigma modulator with one or more integrator stages.

FIG. 1 illustrates an embodiment of a DSM of a DSADC according to the invention. The DSM may comprise one or more integrators 100. An integrator is represented here by structure that comprises a first summer 101, a first de-multiplexer 102, a plurality of integrator memory-elements 103(1)-103(N), a first multiplexer 104, and a first feedback loop

105. The first summer 101 may be configured to input a first analog signal IN, sum the first analog signal to a feedback signal of the first multiplexer 104 and output the summed signal. The first de-multiplexer 102 may be configured to receive the summed signal from the first summer 101, and de-multiplex it into a plurality of output signals to the plurality of memory elements 103(1)-103(N). As will be described later, the integrator memory elements 103(1)-103(N) may be implemented with feedback capacitors that reduce the settling time in each channel. The memory elements 103(1)-103(N) may output signals to the first multiplexer 104 that multiplexes the plurality of signals into a single integrator output-signal. The integrator output signal 105 that includes data of the multiplexed channels may be output for analog-to-digital conversion. The integrator output signal 105 may also be fed back to the first summer 101. As shown in FIG. 1, a higher-order DSM may comprise two or more integrator stages.

The DSM may further comprise an analog-to-digital converter 106, a second summer 107, and a second feedback loop 108. The second feedback loop may comprise a plurality of feedback paths for a plurality of feedback signals. The analog-to-digital converter 106 may be configured to convert the integrator output signal into a digital output signal OUT. As known, delta-sigma-modulation applies error feedback, where change in the signal (delta) is measured and used to improve the conversion by passing the digital output through a digital-to-analog converter and adding (sigma) the resulting analog signal to the input signal. The second feedback loop 108 may thus be configured to convert a digital integrator output signal of the analog-to-digital converter 106 to an analog feedback signal. The second summer 107 may correspondingly be configured to sum the analog feedback signal of the second feedback loop 108 to the initial input signal IN. The result of the input signal IN and the second feedback signal from the digital-to-analog converter 112 is the first analog signal input to the first summer 101, as discussed above. It is understood that the shown configuration is exemplary. For example, the first summer 101 and the second summer 107 may be implemented as one element.

The second feedback loop 108 may comprise a second de-multiplexer 109, a plurality of digital memory elements 110(1)-110(N) on the plurality of feedback paths, a second multiplexer 111 and a digital-to-analog converter 112. The second de-multiplexer 109 may be configured to de-multiplex the digital output signal of the analog-to-digital converter 106. The plurality of digital memory elements 110(1)-110(N) may be implemented with flip-flops or latches, configured to receive the plurality of output-signals of the de-multiplexer 109.

The second multiplexer 111 may be configured to receive the plurality of output-signals from the digital memory elements 110(1)-110(N), and to multiplex the plurality of output-signals into a single digital output-signal to the digital-to-analog converter 112. FIG. 1 illustrates a single-ended signal path, but other elements, like differential digital-to-analog converters, may be applied within the scope. The output of the digital-to-analog converter 112 may be fed to a second summer 107.

When separate delay or memory elements are used for each multiplexed channel in the integrator, almost all analog circuit blocks, such as summing blocks, feedback digital-to analog converters (D/A), analog-to-digital converters (A/D) and amplifiers that are typically needed for implementing integration or resonator stages, may be shared between the channels. The area of these blocks, i.e. the analog circuit blocks, is not significantly scaled down with technology scaling. Therefore the area saving is considerable in multichannel application when parts of the analog domain may now be shared between the channels. On the other hand, memory elements of the second feedback loop and decimation filters may be implemented in the digital domain and hence the chip area for them can be scaled considerably. It is understood that the memory elements within the integrator 100 are implemented in the analog domain and they are to be multiplied according to the number of channels. However, the total area save in a multichannel configuration is considerable.

Figure 2:
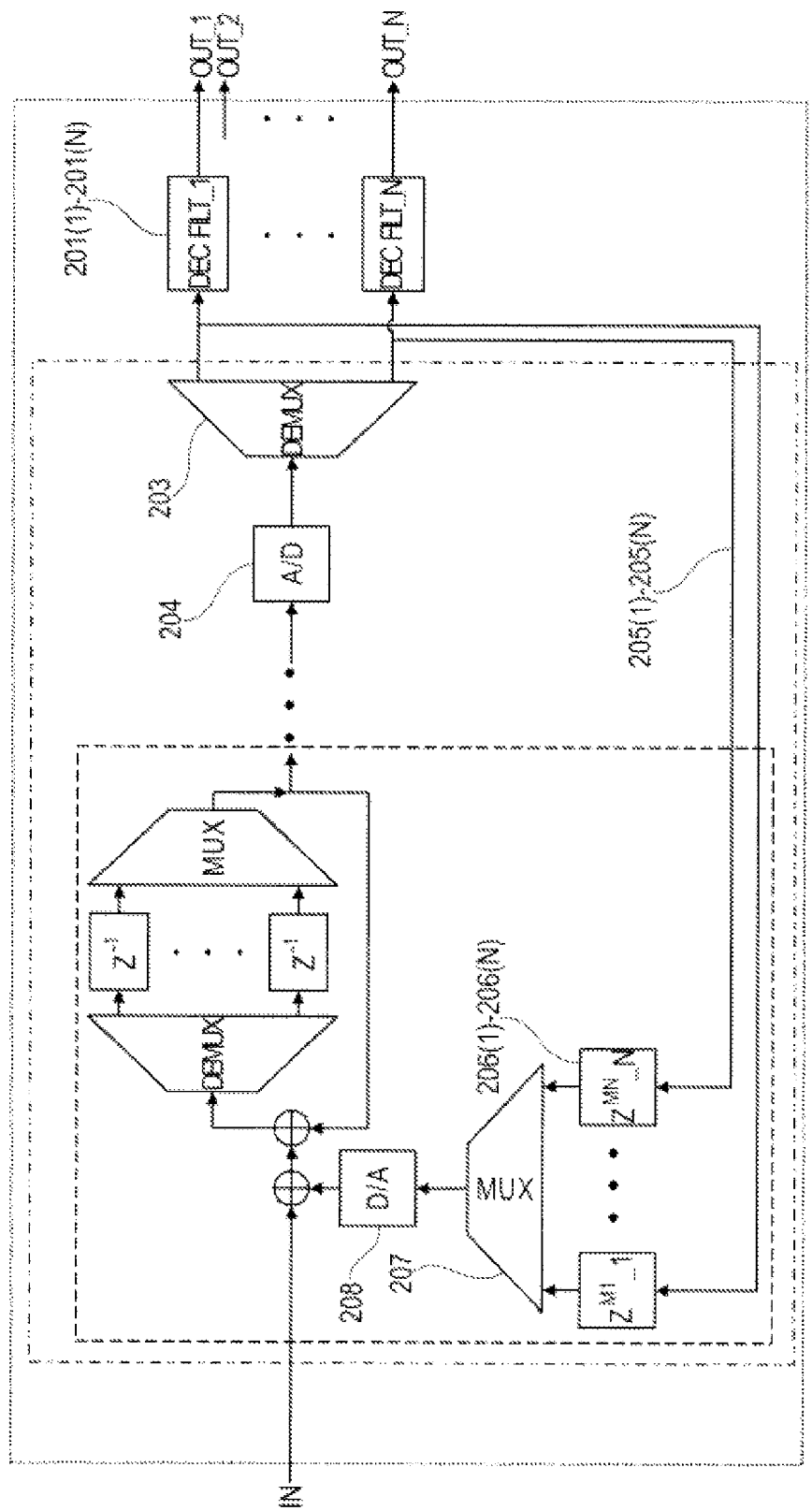
FIG. 2 discloses schematically a delta-sigma modulator wherein a de-multiplexer output forms a parallel output of the modulator.

FIG. 2 illustrates an embodiment of a DSADC including the DSM of FIG. 1. The DSM of the DSADC may comprise a de-multiplexer 203 to which the output signal of the analog-to-digital converter 204 may be fed. The de-multiplexed digital signals may then be filtered through a filtering element. The filtering element may comprise decimation filters 201(1)-201(N) to form the final output signals of the DSADC. As discussed in FIG. 2, before the filtering, the outputs of the de-multiplexer 203 may also be fed through a plurality of digital memory elements 206(1)-206(N) in the feedback path 205(1)-205(N), a multiplexer 207 and a digital-to-analog converter 208, to form a second feedback signal to be added to the input signal of the delta-sigma modulator.

Figure 3:
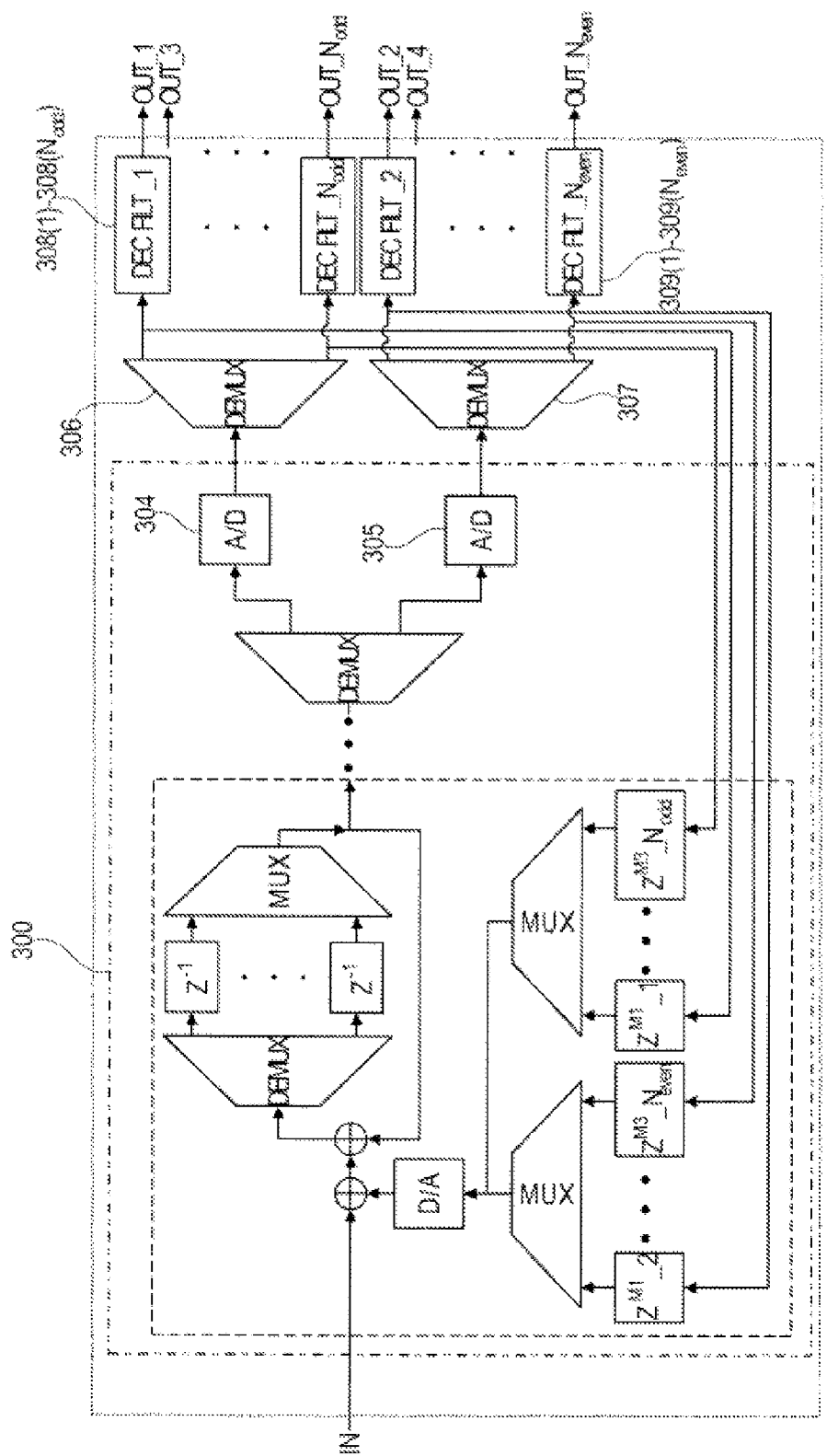
FIG. 3 discloses schematically a delta-sigma modulator comprising two analog-to-digital converters.

FIG. 3 illustrates an alternative embodiment where a plurality of input signals may be fed to a delta-sigma modulator (DSM) 300 and the integrator output signal is de-multiplexed before analog-to-digital conversion. The DSM may comprise two analog-to-digital converters 304, 305 the output of which may be used alternately. The DSM may comprise at least one de-multiplexer 306, 307 for each of the outputs of the analog-to-digital converters. The output signals of the de-multiplexers 306, 307 may be fed through decimation filters 308(1)-308(N$_{odd}$), 309(1)-309(N$_{even}$) to create the final output signals. From the de-multiplexers output signals may also be fed back into the delta-sigma modulator (DSM).

Figure 4:
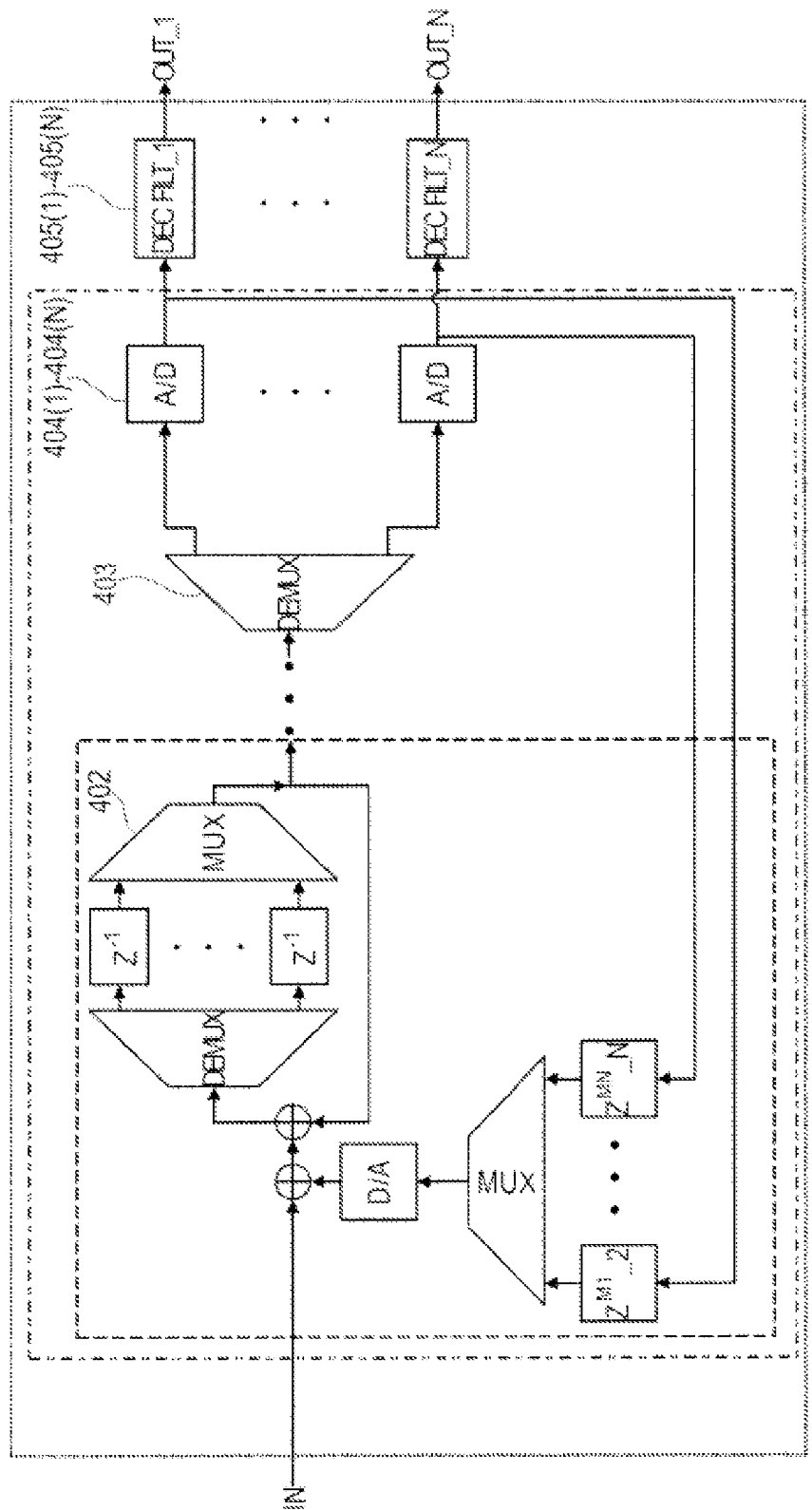
FIG. 4 discloses schematically a delta-sigma modulator with a plurality of analog-to-digital converters.

FIG. 4 illustrates a further alternative embodiment where the integrator output signal is de-multiplexed before analog-to-digital conversion. The DSADC may comprise a second de-multiplexer 403 for de-multiplexing an output signal of the first multiplexer 402 of the integrator, and a plurality of analog to digital converters (A/D) 404(1)-404(N). Preferably one digital converter corresponds to an output channel, i.e. an output signal of the second de-multiplexer 403. The output of the analog to digital converters, i.e. digital signals, may be fed back into the delta-sigma modulator (DSM), as described in the other presented embodiments. The output signals, i.e. the digital signals, may be filtered through decimation filters 405(1)-405(N) to form the final output signal of the DSADC. The embodiment is advantageous if high data rate together with high resolution is required for a plurality of input channels. This is because each analog-to-digital converter has up to N clock periods to complete the conversion and lower over-sampling-rate can be applied in the modulator.

Figure 5:
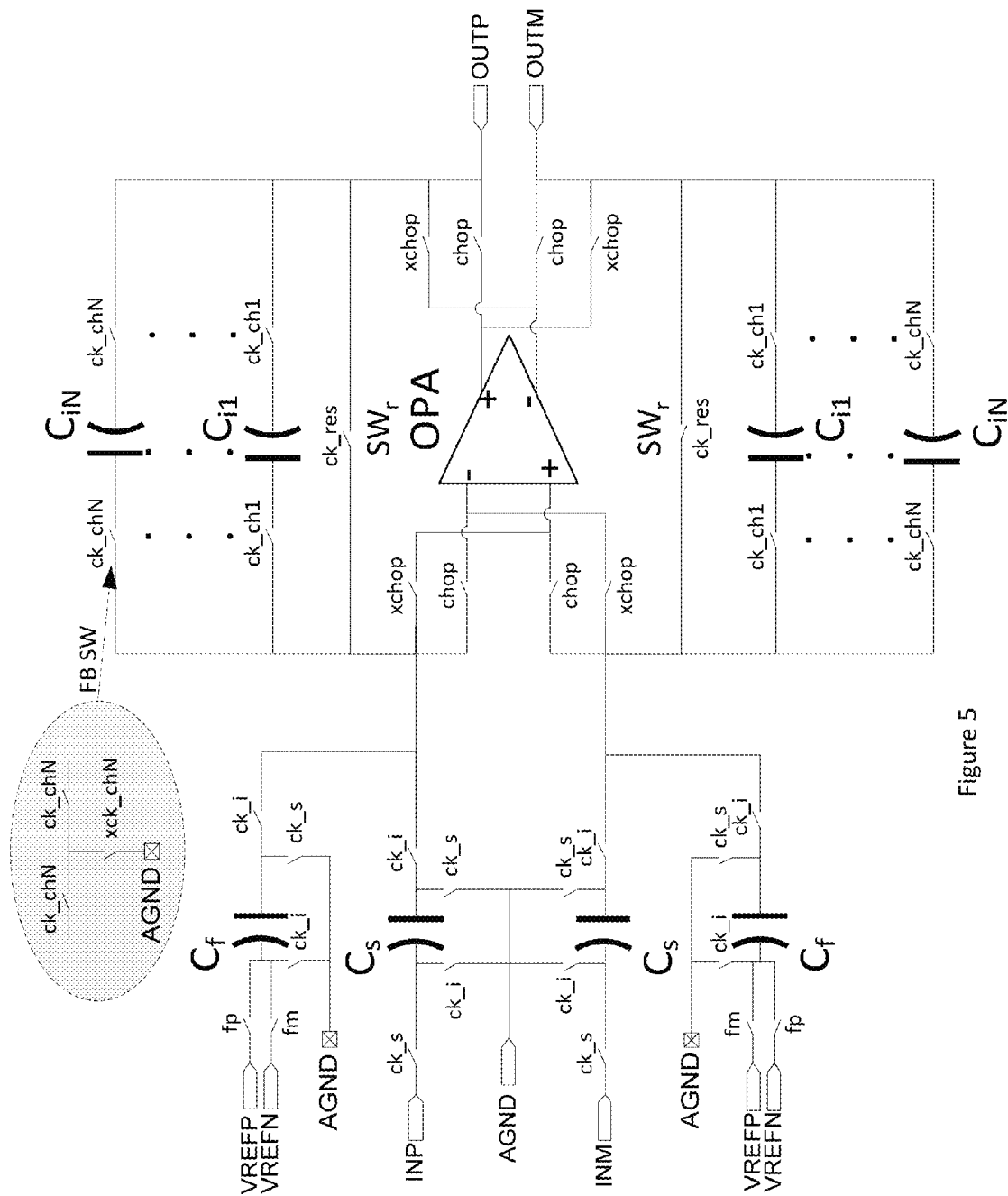
FIG. 5 is a schematic presentation of a differential switched capacitor implementation of a multi-channel delta-sigma-modulator with a 1-bit digital-to-analog converter.

FIG. 5 illustrates an exemplary switched-capacitor (SC) implementation for a DSM of a DSADC. FIG. 5 shows two differential inputs INP and INM. Cs denotes a sampling capacitor of an input path. Cf denotes a feedback capacitor that may operate as a 1 bit D/A of delta-sigma-modulation. FIG. 5 also shows an operational amplifier (OPA) for charge integration and output value holding for a next stage. Ci* denotes here an integrator feedback capacitor that also has the function of a memory element. It may be seen that there are separate Ci* integrator feedback capacitors for each of the input channels.

FIG. 5 illustrates also the switching scheme of the DSADC. As well known to a person skilled in the art, switches can be implemented in many ways. For example, pMOS, or nMOS transistors, or a combination of them may be used. FB SW denotes here a leakage preventing switch structure, an element that is designed to implement feedback switching to reduce channel to channel cross-talk and offset drift, encountered especially in high temperatures due to switch leakage. As shown in FIG. 5, the leakage preventing switch structure may include channel switch elements for activating the memory element, and an inverse channel switch to feed a common mode voltage AGND of the operational amplifier to the memory element when the input channel of the memory element is not active. The AGND voltage works to remove a signal-dependent voltage over the open switch such that a leakage current of the switch is minimal and signal-independent. Thus cross-talk from one input channel to another is eliminated when no signal-dependent leakage current leaks from an inactive channel to an active channel in use. In the configuration of FIG. 5, the leakage preventing switch structure includes channel switch elements in both sides of the memory element. AGND coupling switches, inverse to the channel switches, are in the operational amplifier input side of the memory elements.

The structure of FIG. 5 includes also reset switch elements SWr adapted to reset the operational amplifier between the input channels, as will be described in FIG. 6.

The voltage references of FIG. 5 are denoted as follows: AGND represents a signal ground level, which is the common mode level in the shown differential implementation. VREFP represents a positive reference level for the D/A of DSM, with a potential that is higher than AGND. VREFP can also be a positive power supply. VREFN represents the negative reference level for the D/A of DSM. The potential of VREFN is typically lower than VREFP, usually the target level is (VREFP-AGND) below AGND.

Figure 6:
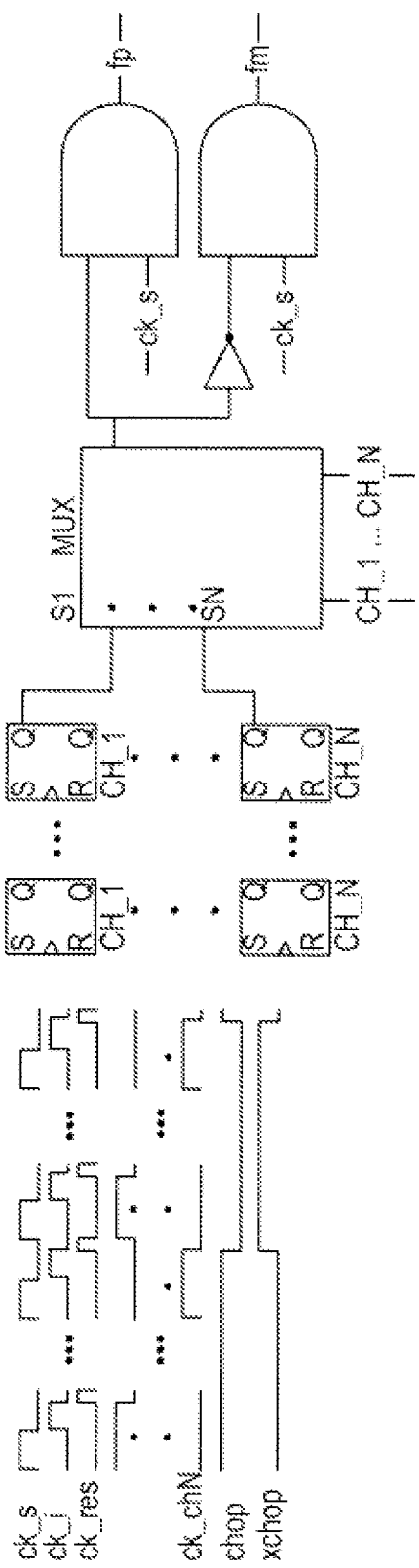
FIG. 6 shows the used clock signals in the embodiment of FIG. 5.

FIG. 6 illustrates timing of the switching in the configuration of FIG. 5. In FIG. 6, the clock signals are denoted as follows: ck_s corresponds to an input signal sampling phase, and ck_i corresponds to a charge integration phase. ck_ch* corresponds to a channel selection/activation clock. chop and its inversion xchop illustrate a chopping clock for reduction of in-band low frequency noise of the operational amplifier. Ck_res corresponds to a reset clock for prevention of channel to channel cross talk. fp/fm corresponds to the control signal of the 1-bit D/A. Non-overlapping clocks are advantageously used.

As understood from FIGS. 5 and 6, the presented exemplary structure is differential and chopping switches have been included to reduce low-frequency noise of the operational amplifier. Chopping may be implemented in the 1st stage only, or also in the following stages. The structure of FIG. 5 can, without chopping, be applied also in a single-ended implementation.

Reset of the operational amplifier between the chopping phases is applicable to remove interference between consecutive samples. This improves system linearity and reduces channel cross-coupling. The reset phase can also be arranged in a different way in the time domain.

Chopping is advantageous in DSM because it does not add to folded white noise and circuit area, while its digital filtering removes up-converted errors together with the quantization noise. Chopping is especially viable in multiplexed modulators that operate on two or more channels, because a reset phase is required in the integrator feedback anyway because of the multiplexing. For functional chopping the chopping clock rate is advantageously at least two times lower than the rate of the lowest channel selection clock.

Figure 7:
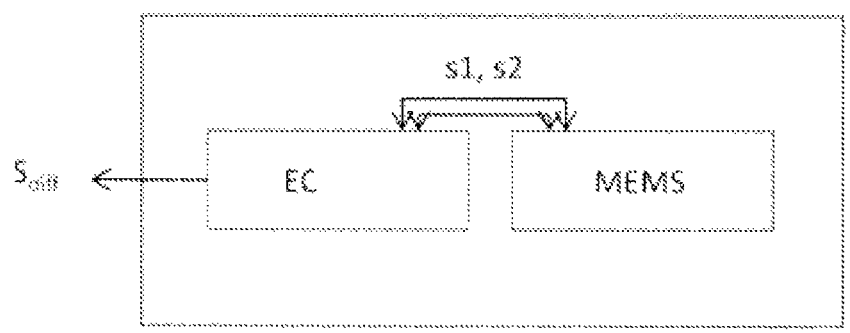
FIG. 7 illustrates an embodiment of a MEMS device that includes a processing circuit of FIG. 2.

FIG. 7 illustrates an embodiment of a MEMS device that includes a first unit and a second unit. The first unit may include a MEMS element and the second unit may include an electronic circuit with a DSADC of any of FIGS. 1 to 4.

The structure according to the invention presents an area efficient way to implement multichannel low-noise high resolution analog-to-digital conversion. The circuit area may be scaled down by increasing the digital density of the ASIC process.

Figure 8:
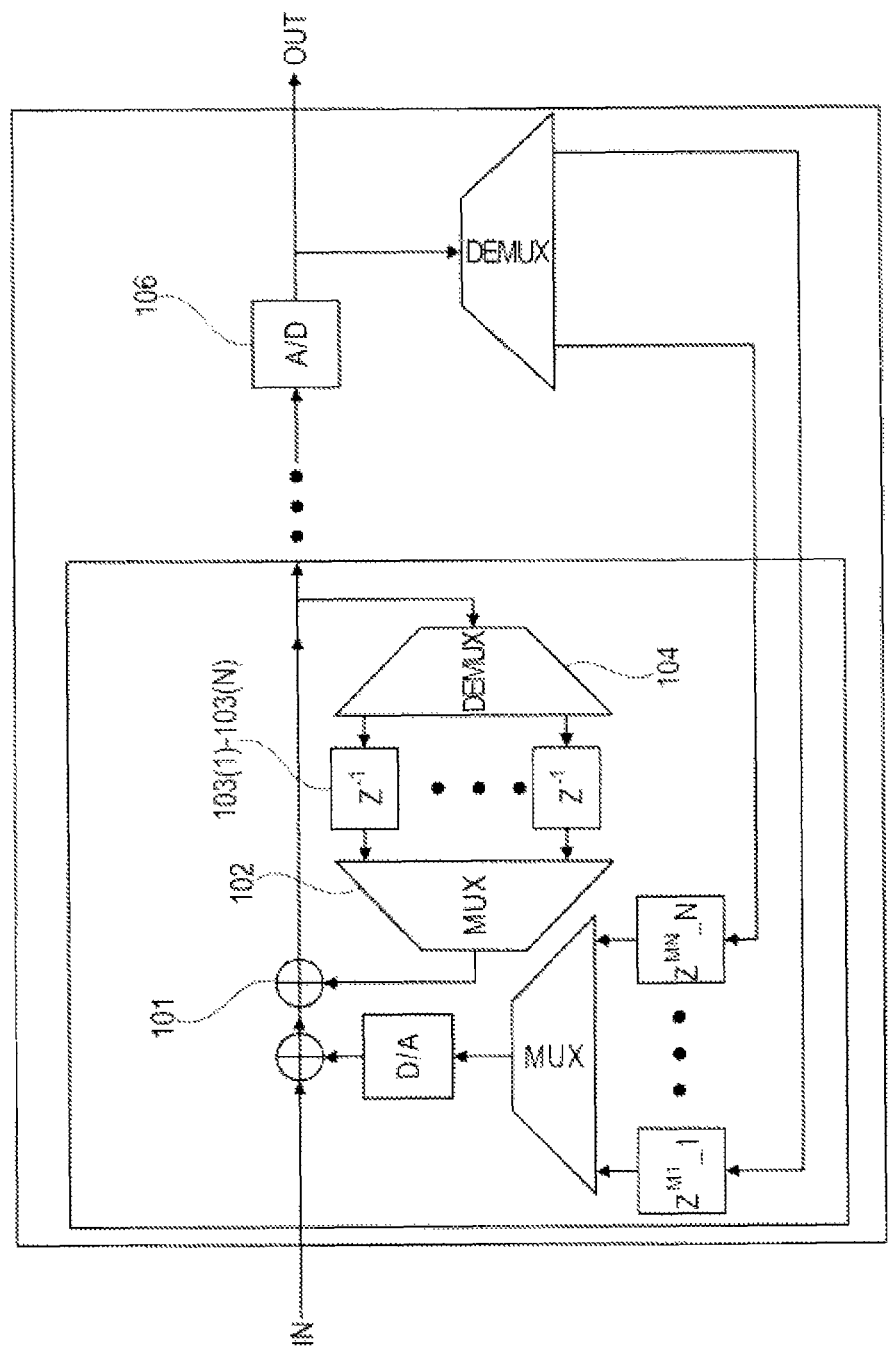
FIG. 8 discloses schematically a delta-sigma modulator wherein an alternative integrator configuration is used.

FIG. 8 illustrates a further alternative DSADC configuration with a schematic where the integrator memory elements 103(1)-103(N) are arranged to the first feedback path. This arrangement refers to a delayless integrator that may be implemented by means of a timing configuration in the multiplexing. The alternative may be implemented in such a way that the reset and channel shift is performed after the sampling phase (ck_s), instead of the charge transfer phase (ck_i). The alternative arrangement can be used to reduce current consumption of the delta-sigma analog-to-digital conversion.

Figure 9:
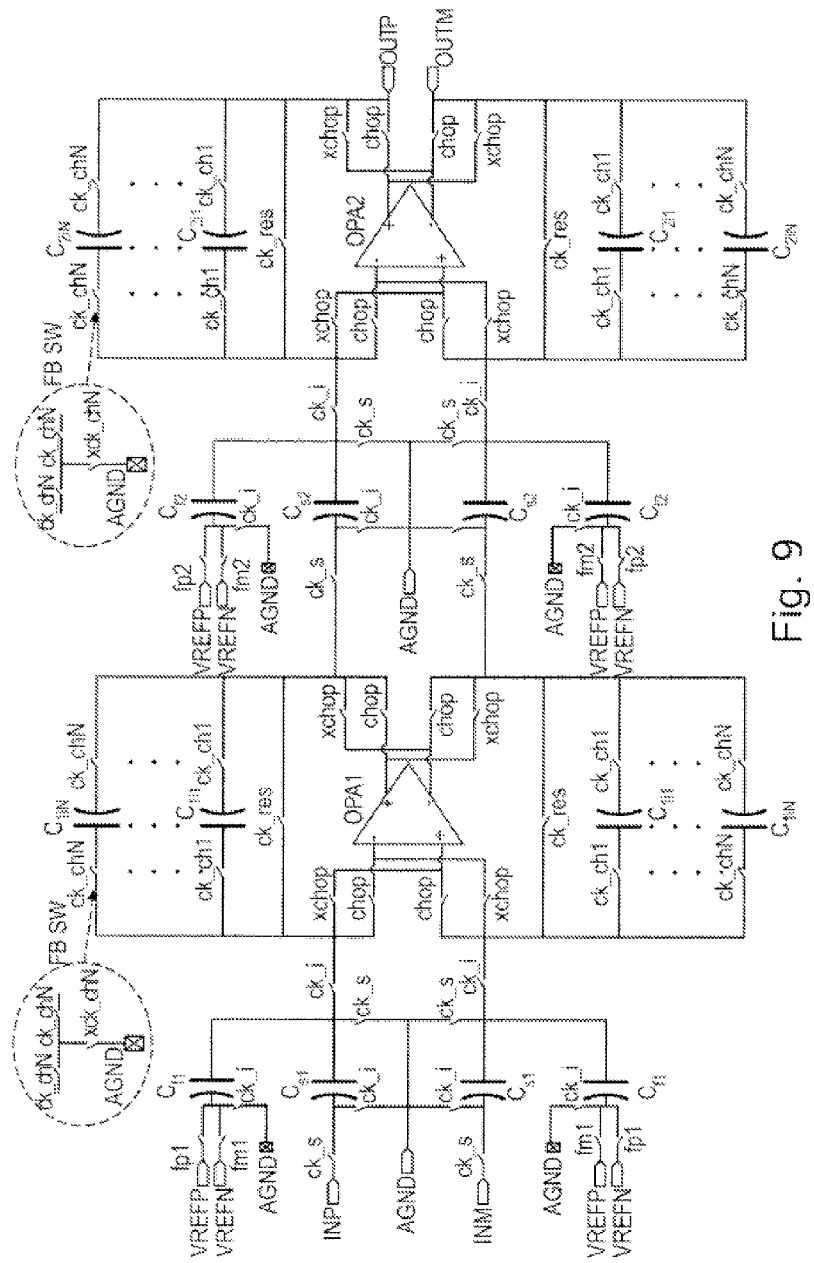
FIG. 9 illustrates an example of two cascaded multiplexed integrator stages.

FIG. 9 illustrates an exemplary switched-capacitor (SC) implementation that includes two cascaded integrator stages. FIG. 9 shows an operational amplifier OPA1 for a first integrator stage and an operational amplifier OPA2 for a second integrator stage. The operational amplifiers OPA1, OPA2 may be used for charge integration and output value holding for the next stage. C1i* of first stage and respectively C2i* of second stage denotes here the integrator feedback capacitor that also has the function of a memory element. It may be seen that the configuration includes separate C1i*, C2i* capacitors for each of the channels 1 . . . N in both of the integrator stages. C1s of first integrator stage and respectively C2s of second integrator stage denotes a sampling capacitor. C1f of first integrator stage and respectively C2f of second integrator stage denotes a feedback capacitor.

The invention provides a significant improvement in the area of low-noise multiplexing delta-sigma AD converters. The arrangement is easy and economical to realize with known components and it is reliable in use.

It should be noted that the foregoing examples of the embodiments of the invention are not intended to restrict the scope of the invention to the specific forms presented above but the present invention is meant rather to cover all modifications, similarities and alternatives which are included in the scope of the present invention, as defined by the appended claims. All additional embodiments, modifications and applications obvious to those skilled in the art are thus included within the spirit and scope of the invention as set forth by the claims appended hereto.

The invention claimed is:

1. A delta-sigma analog-to-digital converter for use with multiplexed input channels, the delta-sigma analog-to-digital converter comprising at least one integrator that includes an operational amplifier, a memory element with a leakage preventing switch structure for each input channel and a reset switch element adapted to reset the operational amplifier between the input channels.

2. The delta-sigma analog-to-digital converter of claim 1, wherein the leakage preventing switch structure includes channel switch elements for activating the memory element, and an inverse channel switch to feed a common mode voltage of the operational amplifier to the memory element when the input channel is not active.

3. The delta-sigma analog-to-digital converter of claim 1, further comprising:
   two inputs for differential detection; and
   an amplifier chopping structure for low frequency noise reduction of the two inputs.

4. The delta-sigma analog-to-digital converter of claim 1, further comprising:

a delta-sigma modulator including one or more integrator stages;

an analog-to-digital converter; and a second feedback loop comprising a plurality of feedback paths for a plurality of feedback signals and a memory element on each feedback path.

5. The delta-sigma analog-to-digital converter according to claim 1, wherein the delta-sigma analog-to-digital converter comprises two analog-to-digital converters the output of which is used alternately.

6. The delta-sigma analog-to-digital converter according to claim 1, wherein the delta-sigma analog-to-digital converter comprises a plurality of analog to digital converters, one for each output channel corresponding to an output signal.

7. The delta-sigma analog-to-digital converter according to claim 1, wherein de-multiplexed digital signals are filtered through decimation filters.

8. The delta-sigma analog to digital converter according to claim 1, wherein the memory-element on a feedback path is a flip-flop, a latch or a capacitor.

9. The delta-sigma analog to digital converter according to claim 1, including a feedback capacitor operating as a 1 bit digital-to-analog converter.

10. The delta-sigma analog-to-digital converter according to claim 1, wherein the at least one integrator is adapted to form a delayless integrator stage.

11. The delta-sigma analog-to-digital converter according to claim 10, wherein a sampling phase is followed by the reset and a channel shift.

12. A microelectromechanical device comprising a delta-sigma analog-to-digital converter according to claim 1.

\* \* \* \* \*